United States Patent [19]

Gans et al.

[11] Patent Number: 5,757,713
[45] Date of Patent: May 26, 1998

[54] ADJUSTABLE WRITE VOLTAGE CIRCUIT FOR SRAMS

[75] Inventors: Dean Gans; John R. Wilford, both of Boise, Id.

[73] Assignee: Micron Technology, Inc., Boise, Id.

[21] Appl. No.: 715,502

[22] Filed: Sep. 18, 1996

[51] Int. Cl.⁶ .................................................. G11C 5/14
[52] U.S. Cl. ............. 365/226; 365/189.09; 365/189.11; 365/156; 365/154
[58] Field of Search ..................... 365/154, 189.09, 365/189.11, 230.06, 230.08, 226, 156; 326/105, 106

[56] References Cited

U.S. PATENT DOCUMENTS

| | | | |
|---|---|---|---|
| 5,020,029 | 5/1991 | Ichinose et al. | 365/154 |
| 5,050,127 | 9/1991 | Mitsumoto et al. | 365/189.09 |
| 5,070,482 | 12/1991 | Miyaji | 365/230.06 |
| 5,309,401 | 5/1994 | Suzuki et al. | 365/203 |

*Primary Examiner*—David C. Nelms
*Assistant Examiner*—Son Mai
*Attorney, Agent, or Firm*—Finnegan, Henderson, Farabow, Garrett & Dunner, L.L.P.

[57] ABSTRACT

A semiconductor integrated circuit includes a biasing circuit connected to a plurality of memory cells via an access line. Each of the memory cells includes at least one switching device. The biasing circuit supplies a potential, having a value between a reference voltage and the threshold voltage of the switching device, to the access line for programming one of the memory cells to a logic low level.

52 Claims, 5 Drawing Sheets

FIG. 6

ADJUSTABLE WRITE VOLTAGE CIRCUIT FOR SRAMS

BACKGROUND OF THE INVENTION

The present invention is directed to a write voltage circuit that allows a logic low level written to a static memory cell to be adjusted over a wide range.

Figure 1:
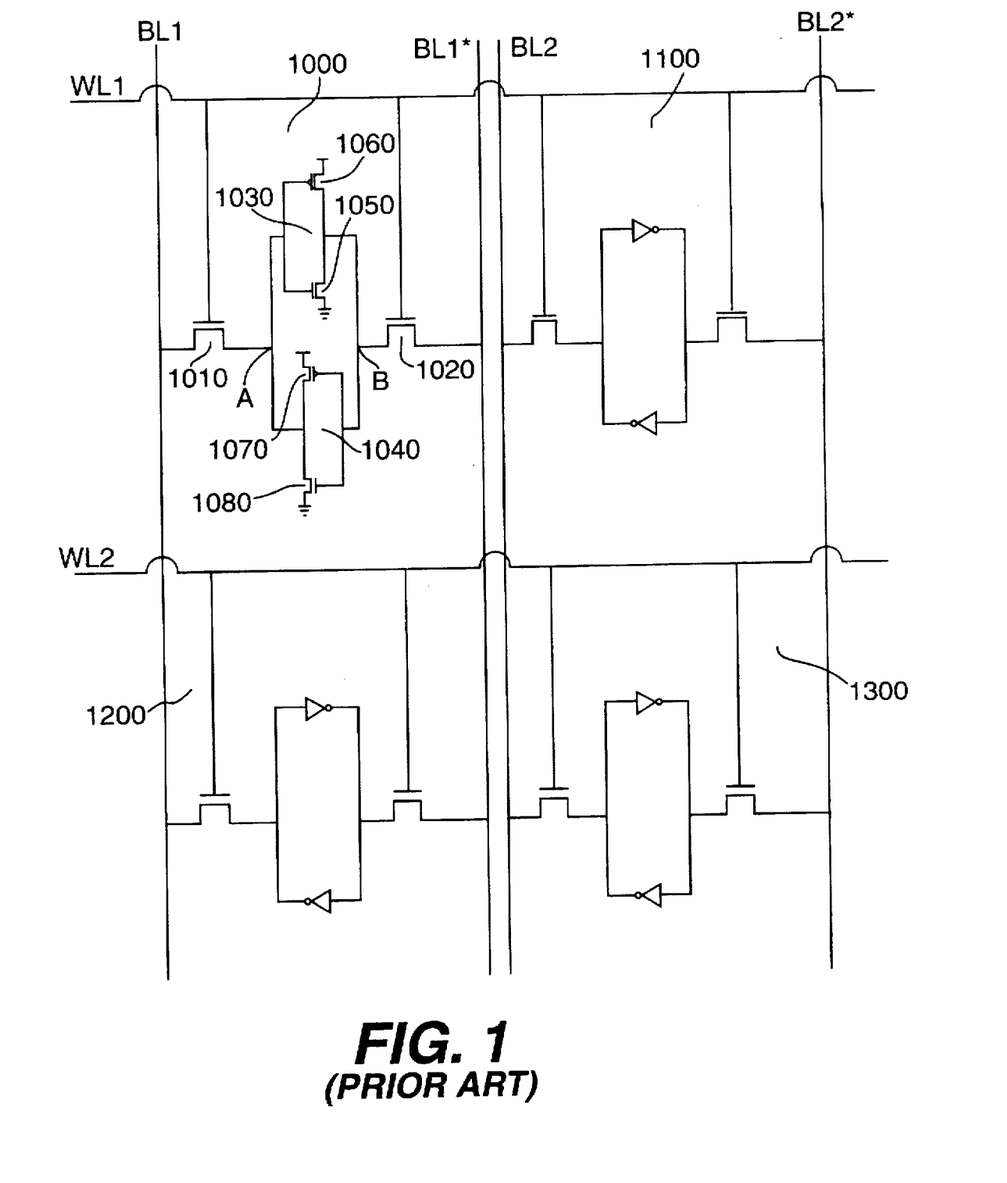
FIG. 1 shows four memory cells of a static memory device.

FIG. 1 shows four memory cells 1000, 1100, 1200, and 1300 of a static memory device, such as a static RAM (SRAM). Each of the memory cells contains identical elements. Memory cell 1000, for example, includes n-channel MOS transistor 1010 and n-channel MOS transistor 1020 connected to inverters 1030 and 1040. Both of the transistors 1010 and 1020 have their gates connected to word line (WL1) and their drains connected to inverters 1030 and 1040. Transistor 1010 has its source connected to bit line (BL1). Whereas, transistor 1020 has its source connected to complementary bit line (BL1*).

Memory cell 1000, includes two inverters 1030 and 1040 having their inputs and outputs respectively connected to each other. As further shown in FIG. 1, inverter 1030 includes series-connected n and p-channel transistors 1050 and 1060, respectively, while inverter 1040 includes series connected p and n-channel transistors 1070 and 1080, respectively.

To select memory cell 1000 for programming, WL1 is set high. When WL1 goes high, both transistors 1010 and 1020 turn on thereby coupling nodes A and B to bit lines BL1 and BL1*, respectively. Accordingly, by setting BL1 high, and thereby setting BL1* low, a logic high voltage level exists at node A, and a logic low voltage is supplied to node B, thereby causing logic high and low voltages to be presented at the inputs of inverters 1030 and 1040, respectively.

The high input at node A causes n-channel transistor 1050 to turn on and p-channel transistor 1060 to turn off, thereby coupling node B (the output of inverter 1030) to ground through n-channel transistor 1050. Similarly, the low input to inverter 1040 causes p-channel transistor 1070 to turn on and n-channel transistor 1080 to turn off, thereby coupling the power supply potential to node A (the output of inverter 1040) through p-channel transistor 1070. The potentials at nodes A and B remain latched and memory cell 1000 stays programmed even when transistors 1010 and 1020 are rendered non-conductive and memory cell 1000 is isolated from bit lines BL1 and BL1*.

To program memory cell 1000 low, the same operations as discussed above occur; however, BL1 is set low and BL1* is set high.

Figure 2:
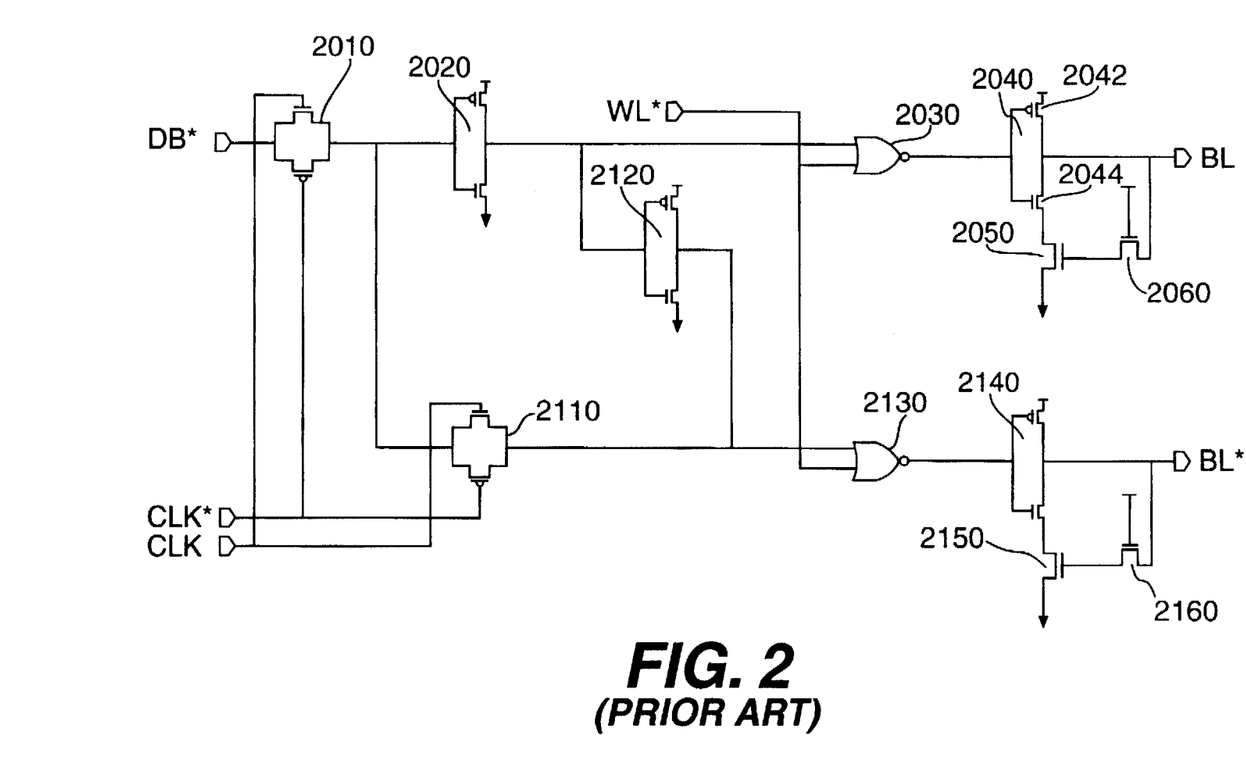
FIG. 2 shows a prior art write voltage circuit.

FIG. 2 shows a conventional write voltage circuit for driving bit lines BL and BL* at their respective voltage levels. Pass gate 2010 receives a complementary data buffer signal (DB*) from a data buffer (not shown). Pass gate 2010 is a CMOS pass gate having n-channel and p-channel transistors, connected as shown in FIG. 2.

Clock signal (CLK) and complementary clock signal (CLK*) are applied to the gate of the n-channel transistor and the p-channel transistor, respectively, of pass gate 2010 to pass DB* as an output to inverter 2020. Inverter 2020 receives DB* and outputs its complement, or DB signal, to NOR gate 2030. NOR gate 2030, in turn, receives the DB signal and a complementary word line signal (WL*) as its inputs and supplies an output to inverter 2040 in response thereto.

As shown in FIG. 2, inverter 2040 includes series-connected p and n-channel transistors 2042 and 2044, respectively. The source of n-channel transistor 2044 is connected to a pair of n-channel transistors 2050 and 2060.

N-channel transistor 2050 has its source connected to ground, its drain connected to the source of n-channel transistor 2044, and its gate connected to the drain of n-channel transistor 2060. N-channel transistor 2060 has its source connected to the output of inverter 2040 and its gate connected to a power supply potential (Vcc). Since the gate of n-channel transistor 2060 is connected to Vcc, the transistor is always on.

For programming a memory cell low, the write circuit shown in FIG. 2 produces a potential that is one transistor threshold voltage (Vt) above ground for application to the bit line of the memory cell. Vt is the minimum voltage required to turn on a transistor and typically has a value of around 0.7 volts.

The prior art write voltage circuit operates as follows. When programming a memory cell low, for example, DB* and WL go high. DB* is passed through pass gate 2010 in response to signal CLK and CLK* being high and low, respectively, to inverter 2020, which, in turn, outputs a low signal. NOR gate 2030 receives the low signal from inverter 2020 and a low WL* signal and outputs a high signal in response thereto.

Inverter 2040 receives the high signal from NOR gate 2030 and outputs a low signal. As the voltage level output of inverter 2040 approaches ground, the signal passes through n-channel transistor 2060 and causes n-channel transistor 2050 to begin to shut off. N-channel transistor 2050 shuts off when the voltage level of the signal output by inverter 2040 reaches Vt, thereby holding the voltage level of the output signal of inverter 2040 to Vt through n-channel transistor 2044. The Vt signal is applied to bit line BL of the memory cell to program it low.

The other elements of the prior art write voltage circuit, namely, pass gate 2110, inverter 2120, NOR gate 2130, inverter 2140, n-channel transistor 2150, and n-channel transistor 2160 are connected and operate similarly to the corresponding elements described above. These elements generate a signal for application on complementary bit line BL* of the memory cell.

Conventional technology allows the low write voltage for programming the memory cell low to be adjusted only to ground or one n-channel threshold voltage (Vt) above ground.

A problem can arise, however, when using ground to program a memory cell low because other memory cells connected to the same word line through lo-Vt column pass devices can also be programmed low. The lo-Vt column pass devices are depletion mode MOS transistors with a Vt close to 0 volts, and act as an interface between the sense amplifiers of the memory device and the bit lines of the memory cell.

A problem can also arise when using Vt to program a memory cell low because Vt may not be low enough to program the memory cell low if the transistors of the memory cell have a slightly higher Vt due to variations in the value of Vt and variations in the access elements of the memory device.

Therefore, a need exists for an adjustable write voltage circuit that can properly program a memory cell to a low logic level without disturbing the other memory cells.

SUMMARY OF THE INVENTION

In accordance with the purpose of the invention as embodied and broadly described herein, the present invention includes a semiconductor integrated circuit that comprises a biasing circuit connected to a plurality of memory cells via an access line. Each of the memory cells includes at least one switching device. The biasing circuit supplies a potential, having a value between a reference voltage and the threshold voltage of the switching device, to the access line for programming one of the memory cells to a logic low level.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention.
In the drawings.

DETAILED DESCRIPTION OF THE PREFERRED EMBODIMENTS

In the following detailed description of the invention, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical, and electrical changes may be made without departing from the spirit and scope of the present invention. The following detailed description is, therefore, not to be taken in a limiting sense, and the scope of the present invention is defined only by the appended claims.

Each transistor described herein is a metal oxide semiconductor field-effect transistor (MOSFET) having a gate, a first current node (drain), and a second current node (source). Since a MOSFET is typically a symmetrical device, the true designation of "source" and "drain" is only possible once a voltage is impressed on the terminals. The designations of source and drain herein should be interpreted, therefore, in the broadest sense.

Figure 3A:
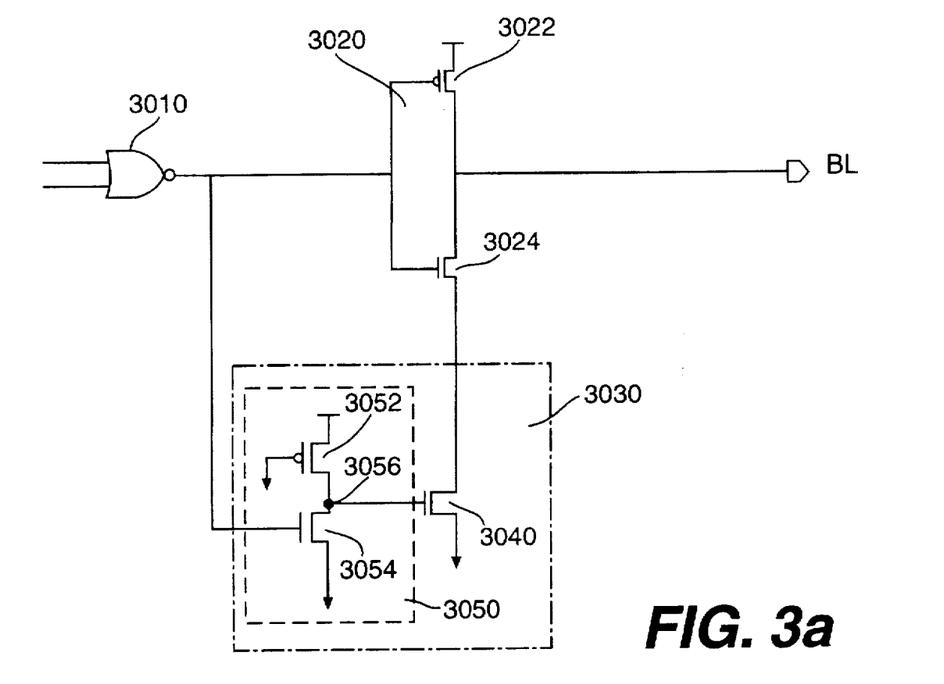
FIG. 3 shows a biasing circuit of a write voltage circuit according to a first embodiment of the present invention.
Figure 3B:
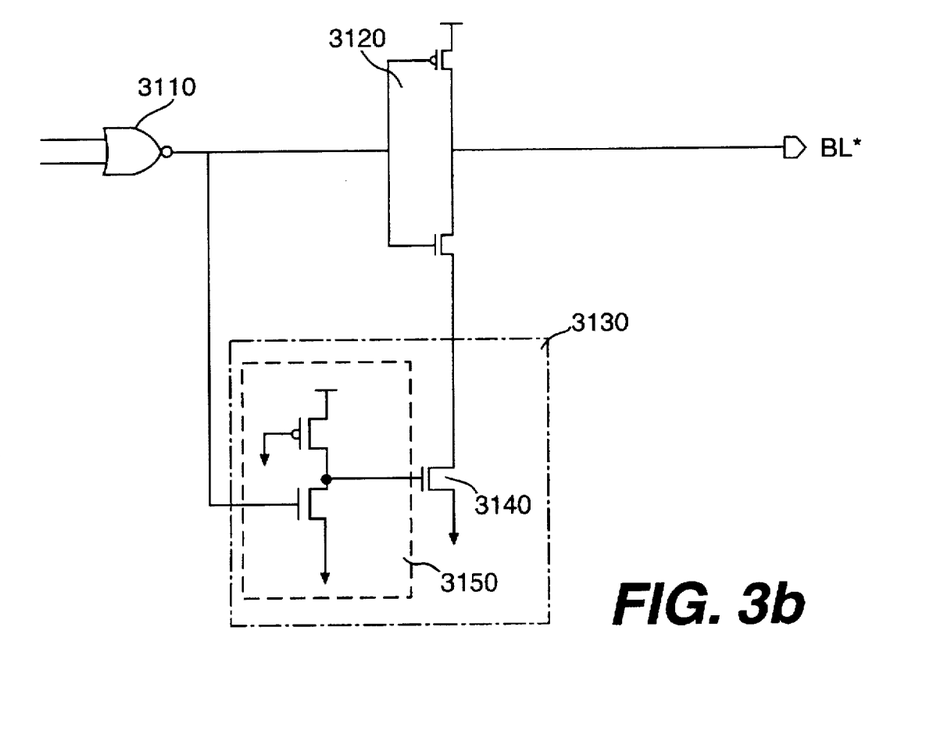

FIG. 3 shows a portion of a write voltage circuit according to a first embodiment of the present invention. The elements of the present inventive write voltage circuit to the left of NOR gate 3010 are the same as those described above in FIG. 2 with respect to the prior art write voltage circuit. Therefore, these elements will not be described in further detail.

Buffer, driver, or inverter circuit 3020 and biasing circuit 3030 receive the output of NOR gate 3010. Inverter 3020, as in the prior art, includes series-connected p and n-channel transistors 3022 and 3024, respectively.

Biasing circuit 3030 preferably includes n-channel MOS transistor 3040 and gate control circuit 3050. N-channel transistor 3040 has its source connected to ground, its drain connected to the source of n-channel transistor 3024 of inverter 3020, and its gate connected to gate control circuit 3050.

Gate control circuit 3050 in the first embodiment preferably includes p-channel MOS transistor 3052 and n-channel MOS transistor 3054 connected together via node 3056. N-channel transistor 3054 has its source connected to ground, its drain connected to node 3056, and its gate connected to the output of NOR gate 3010. P-channel transistor 3052, on the other hand, has its source connected to a power supply potential (Vcc), its drain connected to node 3056, and its gate connected to ground. Because the gate of p-channel transistor 3052 is connected to ground, it is always on and acts like a resistive load.

The write voltage circuit according to the first embodiment operates as follows. When programming a memory cell low, NOR gate 3010 outputs a high signal. The operation of the circuit leading to NOR gate 3010 outputting a high signal was discussed above with respect to the prior art write voltage circuit and is not repeated here.

Prior to NOR gate 3010 supplying a high output, node 3056 and, therefore, the gate of n-channel transistor 3040 are held to a high voltage level (near Vcc) because p-channel transistor 3052 is always on. The high signal from NOR gate 3010, however, turns on n-channel transistor 3054 of gate control circuit 3050 to pull down the potential of the gate of n-channel transistor 3040. The rate at which the voltage level is pulled down and the level to which the voltage is pulled down are adjustable by changing the device sizes of n-channel transistor 3054 and p-channel transistor 3052. In particular, the device sizes of n-channel transistor 3054 and p-channel transistor 3052 are chosen such that the voltage level at node 3056 falls to a level lower than Vt, but higher than ground. Preferably, the node voltage level drops to approximately 0.5 volts.

Changing the gate voltage level of n-channel transistor 3040 varies the impedance of n-channel transistor 3040, which in turn, limits the voltage level of the signal output of inverter 3020 through n-channel transistor 3024. Preferably, the output signal voltage level is in a range of 0.4 to 0.6 volts.

N-channel transistor 3024 of inverter 3020 receives the logic high signal from NOR gate 3010 and turns on. N-channel transistor 3024 then passes a logic low output signal, limited by the impedance imposed by n-channel transistor 3040, onto bit line BL to program the memory cell low. Because the logic low output signal has a voltage level between ground and Vt, the problems arising in the prior art circuit are avoided.

The other elements of the write voltage circuit of the first embodiment, namely, NOR gate 3110, inverter 3120, biasing circuit 3130, n-channel transistor 3140, and gate control circuit 3150 are connected and operate in a similar, but complementary fashion, to the corresponding elements described above. These elements generate a complementary write signal for application on complementary bit line BL* of the memory cell.

Figure 4:
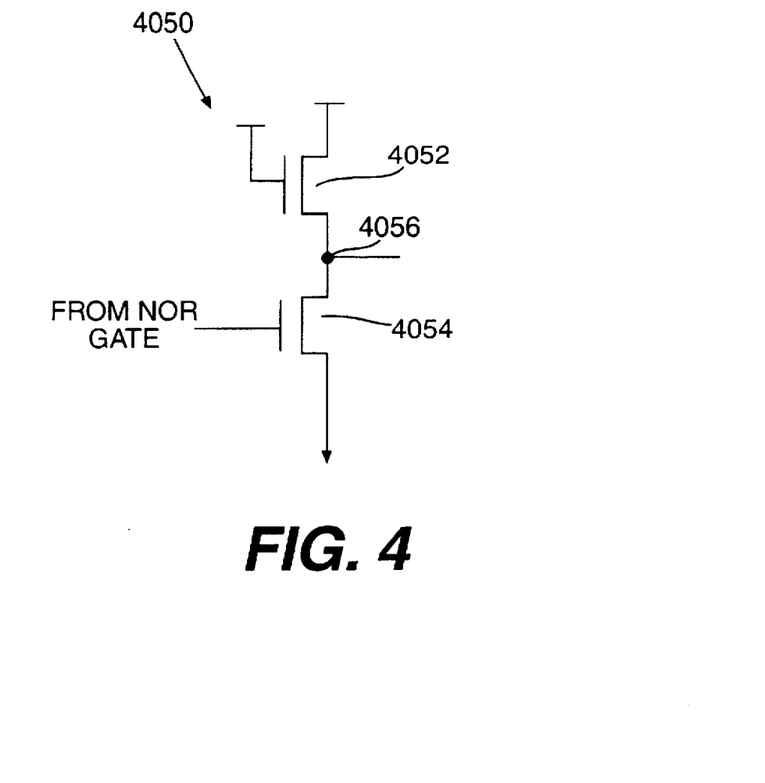
FIG. 4 shows a gate control circuit of the biasing circuit according to a second embodiment of the present invention.

FIG. 4 shows a gate control circuit according to a second embodiment of the present invention. The other elements of the write voltage circuit in the second embodiment are the same as those shown in FIGS. 2 and 3, and their respective operation is the same.

According to the second embodiment, gate control circuit 4050 includes n-channel transistors 4052 and 4054 connected via node 4056. N-channel transistor 4052, having its source and gate connected to Vcc and its drain connected to node 4056, replaces p-channel transistor 3052 in the first embodiment. Because n-channel transistor 4052 has its gate connected to Vcc, it is always on, just like p-channel transistor 3052 in FIG. 3, and similarly serves as a load pull-up device.

The write voltage circuit according to the second embodiment operates in a similar fashion to the write voltage circuit in the first embodiment.

Figure 5:
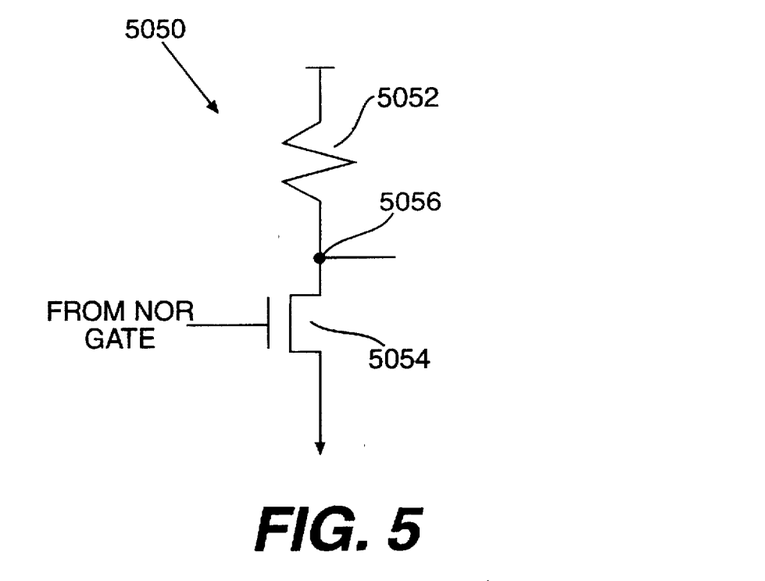
FIG. 5 shows a gate control circuit of the biasing circuit according to a third embodiment of the present invention.

FIG. 5 shows a gate control circuit according to a third embodiment of the present invention. The other elements of the write voltage circuit in the third embodiment are the same as those shown in FIGS. 2 and 3, and their respective operation is the same.

In accordance with the third embodiment, gate control circuit 5050 includes resistor 5052 and n-channel transistor 5054 connected together via node 5056. In the third embodiment, resistor 5052, with one end connected to Vcc and the other end connected to node 5056, acts as the load device in the gate control circuit. Resistor 5052 replaces p-channel transistor 3052 and n-channel transistor 4052 in the first and second embodiments, respectively. Resistor 5052 preferably has a value equal to the on-resistance of p-channel transistor 3052 in FIG. 3, and is chosen such that the voltage level of node 5056 is around 0.5 volts.

With this exception, the write voltage circuit according to the third embodiment operates in a similar fashion to the write voltage circuits in the first and second embodiments.

Figure 6:
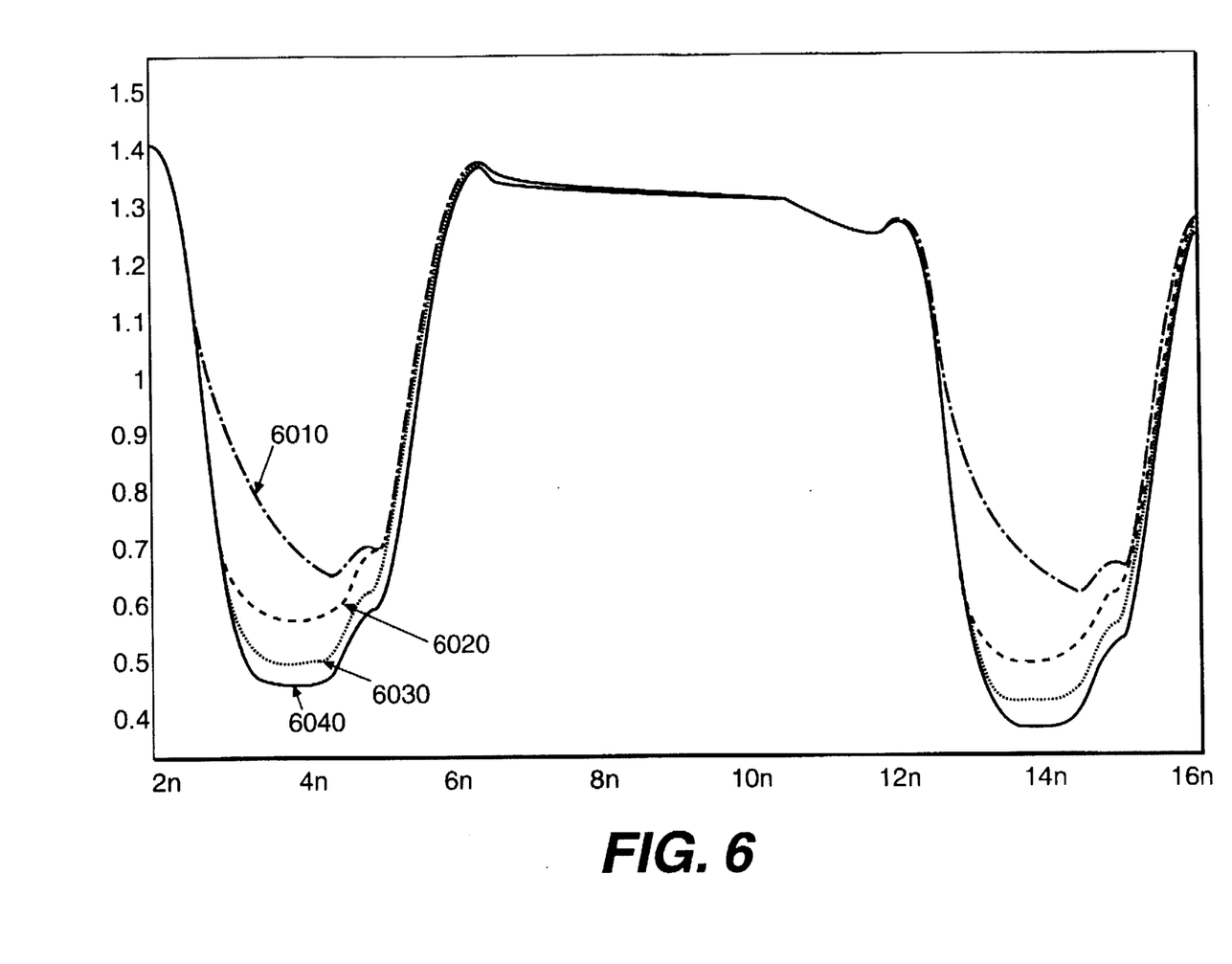
FIG. 6 shows a graph depicting the write voltage circuit output according to the prior art and the present invention.

FIG. 6 is a graph depicting the voltage level output of the write voltage circuits of the prior art and the present invention for programming a memory cell to a logic low level. Curve 6010 corresponds to the output of the prior art write voltage circuit supplying a Vt low write voltage of 0.7 volts. Curves 6020, 6030, and 6040 correspond to outputs of the write voltage circuit according to the present invention. As further shown in FIG. 6, the voltage level outputs of the inventive write voltage circuit are adjustable to a voltage level preferably between 0.4 and 0.6 volts.

As can be seen by FIGS. 3–6, the write voltage circuit according to the present invention has an output that is adjustable within a range of 0 to Vt such that the problems of the prior art write voltage circuits can be avoided.

The foregoing description of preferred embodiments of the present invention has been presented for purposes of illustration and description. It is not intended to be exhaustive or to limit the invention to the precise form disclosed, and modifications and variations are possible in light of the above teachings or may be acquired from practice of the invention. For example, even though memory cells having six transistors were disclosed in the preferred embodiment, the invention is equally applicable to memory cells having a different number of transistors (e.g., four transistors). The scope of the invention is defined by the claims and their equivalents.

What is claimed is:

1. A semiconductor integrated circuit, comprising:

a plurality of memory cells, each of the plurality of memory cells comprising at least one first switching device;

an access line connected to the plurality of memory cells; and a write circuit for supplying a potential to the access line, the potential having a value between a reference voltage and a threshold voltage of the at least one first switching device, the write circuit including:

a buffer circuit coupled to the access line, and a biasing circuit having a second switching device coupled to receive a control voltage, the control voltage causing the second switching device to supply the potential to the access line via the buffer circuit.

2. The semiconductor integrated circuit of claim 1, wherein the biasing circuit further comprises a gate control circuit generating the control voltage, the gate control circuit comprising:

a third switching device; and a load element coupled to the third switching device at a node, the control voltage being supplied to the second switching device from the node.

3. The semiconductor integrated circuit of claim 2, wherein the load element comprises a resistor.

4. The semiconductor integrated circuit of claim 2, wherein the load element comprises an n-channel MOS transistor having source and gate electrodes coupled to a power supply, and a drain electrode coupled to the node.

5. The semiconductor integrated circuit of claim 2, wherein the load element comprises a p-channel MOS transistor having a source electrode coupled to a power supply, a gate electrode coupled to the reference voltage, and a drain electrode coupled to the node.

6. The semiconductor integrated circuit of claim 2, wherein the third switching device comprises an n-channel MOS transistor.

7. The semiconductor integrated circuit of claim 2, wherein the buffer circuit is a first buffer circuit and the writing circuit further comprises:

a pass gate connected to receive a data buffer signal, a second buffer circuit connected to receive an output of the pass gate, and a logic gate connected to receive an output of the second buffer circuit and a word line signal, the logic gate outputting a signal for rendering the third switching device conductive.

8. The semiconductor integrated circuit of claim 1, wherein the potential is a programming signal for programming one of the plurality of memory cells to a logic low level.

9. The semiconductor integrated circuit of claim 1, wherein the buffer circuit comprises an inverter.

10. The semiconductor integrated circuit of claim 1, wherein the potential is a programming signal for programming one of the plurality of memory cells to a logic low level.

11. The semiconductor integrated circuit of claim 1, wherein the reference voltage is ground.

12. The semiconductor integrated circuit of claim 1, wherein the potential is a first potential, the semiconductor integrated circuit further comprising:

a complementary access line carrying a second potential having a value complementary to the first potential, the complementary access line being coupled to the plurality of memory cells; and a complementary write circuit supplying the second potential to the complementary access line, the second potential at times having a voltage between a reference voltage and a threshold voltage of the at least one first switching device.

13. A semiconductor memory, comprising:

a plurality of memory cells, each of the plurality of memory cells comprising at least one first switching device;

an access line connected to the plurality of memory cells;

a write circuit connected to the access line for writing data into the plurality of memory cells, the write circuit generating a potential having a value between a reference voltage and a threshold voltage of the at least one first switching device for application to the access line, the write circuit including:
- a buffer circuit coupled to supply the potential to the access line, and
- a biasing circuit generating the potential and having a second switching device coupled to receive a control voltage, the control voltage causing the second switching device to supply the potential to the access line via the buffer circuit.

14. The semiconductor memory of claim 13, wherein the biasing circuit further comprises a gate control circuit generating the control voltage, the gate control circuit comprising:
- a third switching device; and
- a load element coupled to the third switching device at a node, the control voltage being supplied to the second switching device from the node.

15. The semiconductor memory of claim 14, wherein the load element comprises a resistor.

16. The semiconductor memory of claim 14, wherein the load element comprises an n-channel MOS transistor having source and gate electrodes coupled to a power supply, and a drain electrode coupled to the node.

17. The semiconductor memory of claim 14, wherein the load element comprises a p-channel MOS transistor having a source electrode coupled to a power supply, a gate electrode coupled to the reference voltage, and a drain electrode coupled to the node.

18. The semiconductor memory of claim 14, wherein the third switching device is an n-channel MOS transistor.

19. The semiconductor memory of claim 14, wherein the buffer circuit is a first buffer circuit and the writing circuit further comprises:
- a pass gate connected to receive a data buffer signal,
- a second buffer circuit connected to receive an output of the pass gate, and
- a logic gate connected to receive an output of the second buffer circuit and a word line signal, the logic gate outputting a signal for rendering the third switching device conductive.

20. The semiconductor memory of claim 13, wherein the potential is a programming signal for programming one of the plurality of memory cells to a logic low level.

21. The semiconductor memory of claim 13, wherein the buffer circuit comprises an inverter.

22. The semiconductor memory of claim 13, wherein the potential is a programming signal for programming one of the plurality of memory cells to a logic low level.

23. The semiconductor memory of claim 13, wherein the reference voltage is ground.

24. The semiconductor memory of claim 13, wherein the potential is a first potential, the semiconductor memory further comprising:
- a complementary access line carrying a second potential having a value complementary to the first potential; and
- a complementary write circuit supplying the second potential to the complementary access line, the second potential at times having a voltage between a reference voltage and a threshold voltage of the at least one first switching device of the plurality of memory cells.

25. A method of operating a semiconductor memory, the semiconductor memory comprising a plurality of memory cells coupled to an access line and a biasing circuit, each of the plurality of memory cells having at least one first switching device, the biasing circuit including a second switching device connected to receive a control voltage, the method comprising the steps of:
- generating, in the biasing circuit, a potential having a voltage between a reference voltage and a threshold voltage of the at least one first switching device;
- supplying the control voltage to the second switching device;
- outputting the potential from the second switching device in response to the control voltage;
- applying the potential to the access line;
- selecting one of the memory cells; and
- supplying the potential to the selected memory cell from the access line.

26. The method of claim 25, wherein the potential is a programming signal for programming one of the plurality of memory cells, the method further comprising the step of:
- programming the selected memory cell with information corresponding to the programming signal.

27. The method of claim 26, wherein the programming step comprises the step of:
- programming the selected memory cell to a logic low level using the programming signal.

28. The method of claim 25, wherein the biasing circuit further comprises a gate control circuit, and wherein the supplying step comprises the step of:
- generating the control voltage in the gate control circuit.

29. A method of programming a memory cell of a semiconductor memory, the semiconductor memory comprising a plurality of memory cells coupled to an access line and a biasing circuit, each of the plurality of memory cells having at least one first switching device, the biasing circuit including a second switching device connected to receive a control voltage, the method comprising the steps of:
- generating, in the biasing circuit, a programming signal having a voltage between a reference voltage and a threshold voltage of the at least one first switching device;
- supplying the control voltage to the second switching device;
- outputting the programming signal from the second switching device in response to the control voltage;
- applying the programming signal to the access line;
- selecting one of the memory cells to be programmed;
- supplying the programming signal to the selected memory cell from the access line; and
- programming the selected memory cell with information corresponding to the programming signal.

30. The method of claim 29, wherein the programming step comprises the step of:
- programming the selected memory cell to a logic low level using the programming signal.

31. The method of claim 29, wherein the biasing circuit further comprises a gate control circuit, and wherein the control voltage supplying step comprises the step of:
- generating the control voltage in the gate control circuit.

32. A write circuit for programming a memory cell of a semiconductor memory, the semiconductor memory comprising a plurality of memory cells coupled to an access line, each of the plurality of memory cells having at least one first switching device, the write circuit comprising:
- a buffer circuit coupled to the access line; and a biasing circuit, coupled to the buffer circuit, for generating a potential for writing to the plurality of memory cells, the potential having a value between a reference voltage and a threshold voltage of the at least one first switching device, the biasing circuit including a second switching device coupled to receive a control voltage, the control voltage causing the second switching device to supply the potential to the access line via the buffer circuit.

33. The write circuit of claim 32, wherein the biasing circuit further comprises a gate control circuit generating the control voltage, the gate control circuit comprising:

a third switching devices; and a load element coupled to the third switching device at a node, the control voltage being supplied to the second switching device from the node.

34. The write circuit of claim 33, wherein the load element comprises a resistor.

35. The write circuit of claim 33, wherein the load element comprises an n-channel MOS transistor having source and gate electrodes coupled to a power supply, and a drain electrode coupled to the node.

36. The write circuit of claim 33, wherein the load element comprises a p-channel MOS transistor having a source electrode coupled to a power supply, a gate electrode coupled to the reference voltage, and a drain electrode coupled to the node.

37. The write circuit of claim 33, wherein the third switching device is an n-channel MOS transistor.

38. The write circuit of claim 33, wherein the buffer circuit is a first buffer circuit and the writing circuit further comprises:

a pass gate connected to receive a data buffer signal;

a second buffer circuit connected to receive an output of the pass gate; and a logic gate connected to receive an output of the second buffer circuit and a word line signal, the logic gate outputting a signal for rendering the third switching device conductive.

39. The write circuit of claim 32, wherein the potential is a programming signal for programming one of the plurality of memory cells to a logic low level.

40. The write circuit of claim 32, wherein the buffer circuit comprises an inverter.

41. The write circuit of claim 32, wherein the potential is a programming signal for programming one of the plurality of memory cells to a logic low level.

42. The write circuit of claim 32, wherein the reference voltage is ground.

43. The write circuit of claim 32, wherein the potential is a first potential, and the semiconductor memory further comprises a complementary access line carrying a second potential having a value complementary to the first potential, the write circuit further comprising:

a complementary biasing circuit supplying the second potential to the complementary access line, the second potential at times having a value between a reference voltage and a threshold voltage of the at least one first switching device.

44. A semiconductor integrated circuit, comprising:

a plurality of memory cells, each of the plurality of memory cells comprising at least one first switching device;

an access line connected to the plurality of memory cells;

a complementary access line connected to the plurality of memory cells; and a write circuit including:

a buffer circuit coupled to the access line, a biasing circuit supplying a first potential to the access line, the first potential at times having a value between a reference voltage and a threshold voltage of the at least one first switching device, the biasing circuit including a second switching device coupled to receive a first control voltage, the first control voltage causing the second switching device to supply the first potential to the access line via the buffer circuit, a complementary buffer circuit coupled to the complementary access line, and a complementary biasing circuit supplying a second potential to the complementary access line, the second potential at other times having a value between a reference voltage and a threshold voltage of the at least one first switching device, the complementary biasing circuit including a third switching device coupled to receive a second control voltage, the second control voltage causing the third switching device to supply the second potential to the complementary access line via the complementary buffer circuit.

45. The semiconductor integrated circuit of claim 44, wherein the biasing and complementary biasing circuits each further comprises a gate control circuit generating the control voltage, the gate control circuit comprising:

a fourth switching device, and a load element coupled to the fourth switching device at a node, the control voltage being supplied to the second and third switching devices from the node.

46. The semiconductor integrated circuit of claim 45, wherein the load element comprises a resistor.

47. The semiconductor integrated circuit of claim 45, wherein the load element comprises an n-channel MOS transistor having source and gate electrodes coupled to a power supply, and a drain electrode coupled to the node.

48. The semiconductor integrated circuit of claim 45, wherein the load element comprises a p-channel MOS transistor having a source electrode coupled to a power supply, a gate electrode coupled to the reference voltage, and a drain electrode coupled to the node.

49. The semiconductor integrated circuit of claim 45, wherein the fourth switching device comprises an n-channel MOS transistor.

50. The semiconductor integrated circuit of claim 44, wherein the first and second potentials are programming signals for programming one of the plurality of memory cells to a logic low level.

51. The semiconductor integrated circuit of claim 44, wherein the first and second potentials are programming signals for programming one of the plurality of memory cells to a logic low level.

52. The semiconductor integrated circuit of claim 44, wherein the reference voltage is ground.

* * * * *